United States Patent [19]

Yamakawa et al.

[11] Patent Number: 5,399,536
[45] Date of Patent: Mar. 21, 1995

[54] SILICON NITRIDE SINTERED BODY

[75] Inventors: Akira Yamakawa; Koichi Sogabe, both of Hyogo, Japan

[73] Assignee: Sumitomo Electric Industries, Ltd., Osaka, Japan

[21] Appl. No.: 122,186

[22] Filed: Sep. 17, 1993

Related U.S. Application Data

[63] Continuation of Ser. No. 789,025, Nov. 7, 1991, abandoned.

[30] Foreign Application Priority Data

Nov. 17, 1990 [JP] Japan .................. 2-301620
Dec. 19, 1990 [JP] Japan .................. 2-412203

[51] Int. Cl.$^6$ .............................. C04B 35/58
[52] U.S. Cl. ........................ 501/97; 423/344
[58] Field of Search ............. 501/97; 423/344

[56] References Cited

U.S. PATENT DOCUMENTS

| | | | |
|---|---|---|---|
| 4,354,990 | 10/1982 | Martinengo et al. | 264/65 |
| 4,608,354 | 8/1986 | Avella et al. | 264/65 |
| 4,618,541 | 10/1986 | Forouhi et al. | 428/688 |
| 4,692,419 | 9/1987 | Matsui et al. | 501/97 |
| 4,692,420 | 9/1987 | Oda et al. | 501/97 |
| 4,859,639 | 8/1989 | Sterzel | 501/97 |
| 4,902,653 | 2/1990 | Komatsu et al. | 501/97 |
| 4,960,656 | 10/1990 | Chang et al. | 428/704 |
| 4,977,112 | 12/1990 | Matsui | 501/97 |
| 5,032,554 | 7/1991 | Mizuno et al. | 501/97 |
| 5,049,531 | 9/1991 | Nakanishi et al. | 501/98 |
| 5,089,449 | 2/1992 | Miwa et al. | 501/98 |
| 5,096,859 | 3/1992 | Sakai et al. | 501/92 |
| 5,100,847 | 3/1992 | Li et al. | 501/97 |

FOREIGN PATENT DOCUMENTS

| | | | |
|---|---|---|---|
| 57-179077 | 11/1982 | Japan | 501/97 |
| 58-41771 | 3/1983 | Japan | 501/97 |
| 3195047 | 8/1991 | Japan . | |
| 2129788 | 5/1984 | United Kingdom | 501/97 |
| WO8803917 | 6/1988 | WIPO . | |

Primary Examiner—Mark L. Bell
Assistant Examiner—Deborah Jones
Attorney, Agent, or Firm—Sughrue, Mion, Zinn, Macpeak & Seas

[57] ABSTRACT

A silicon nitride sintered body comprising 3.5% by weight or less of aluminum, 3.5% by weight or less of oxygen and the balance of silicon nitride; and a silicon nitride sintered body comprising 90% by weight or more of silicon nitride, 3.5% by weight or less of aluminum, 3.5% by weight or less of oxygen and from 0.01 to 10% by weight of at least one metallic element selected from the group consisting of Ti, Zr, Hf, V, Nb, Ta, Cr, Mo, W, Fin, Fe, Co, Ni, Nd, and Ho. These sintered bodies have a density of 3.15 g/cm$^3$ or more and a thermal conductivity of 40 W/mK or more.

6 Claims, No Drawings

SILICON NITRIDE SINTERED BODY

This is a Continuation of application Ser. No. 07/789,025 filed Nov. 7, 1991, now abandoned.

FIELD OF THE INVENTION

The present invention relates to a silicon nitride sintered body suited for use as an electronic circuit substrate material, an IC package material and the like.

BACKGROUND OF THE INVENTION

Silicon nitride ($Si_3N_4$) sintered bodies have excellent corrosion and heat resistance and high strength and, hence, have been used as various high-temperature materials. Further, owing to their advantages of good insulating properties and high chemical stability, silicon nitride sintered bodies have been used also as insulating substrate materials for electronic circuits such as ICs and the like.

In particular, with the recent trend in semiconductors toward higher degrees of integration and larger capacities, various attempts have been made to obtain insulating substrate materials having high thermal conductivity and, as a result, BeO sintered bodies with high thermal conductivity have been developed, followed by AlN sintered bodies and SiC sintered bodies both having good thermal conductivity.

However, the AlN sintered bodies have a drawback that they form a hydroxide in high-temperature steam to have impaired insulating properties, while the SiC sintered bodies have the inherent problem of high dielectric constants. Because of these drawbacks, both the AlN and SiC sintered bodies are at present used in only limited applications.

On the other hand, $Si_3N_4$ sintered bodies have high strength, but it has been difficult to obtain $Si_3N_4$ sintered bodies with high thermal conductivity. The reason for this is as follows. In general, a high degree of densification is difficult for $Si_3N_4$. Further, $Si_3N_4$ sintered bodies have conventionally been produced by liquid-phase sintering employing a sintering aid because high-temperature sintering poses the problem, for example, of the decomposition or sublimation of $Si_3N_4$. In the liquid-phase sintering, $Al_2O_3$ is used as the sintering aid to produce Sialon compounds in order to attain improved high-temperature strength and good resistance to oxidation at high temperatures. Thus, most studies have not been directed toward the development of higher-purity $Si_3N_4$ sintered bodies. It has also been difficult to synthesize $Si_3N_4$ powders having high purities.

Therefore, in the conventional $Si_3N_4$ sintered bodies, heteroatoms such as Al and O which were contained in the sintering aids or $Si_3N_4$ powders have come into the sintered bodies and such heteroatoms remain as intergranular layers or are present in the $Si_3N_4$ lattices to form solid solutions. Accordingly, the thus-obtained $Si_3N_4$ sintered bodies cannot fully exhibit the properties originally possessed by $Si_3N_4$ and their thermal conductivities reported so far are normally as low as about 15 W/mK.

Because of such low thermal conductivities, $Si_3N_4$ sintered bodies have not yet been put to practical use as electronic circuit substrates, although this application has been proposed in JP-A-62-30663. (The term "JP-A" as used herein means an "unexamined Japanese patent application".)

SUMMARY OF THE INVENTION

An object of the present invention is to provide a silicon nitride sintered body having high thermal conductivity.

Other objects and effects of the present invention will be apparent from the following description.

The present invention provides, in a first embodiment, a silicon nitride sintered body comprising 3.5% by weight or less of aluminum, 3.5% by weight or less of oxygen and the balance of silicon nitride, the sintered body having a density of 3.15 g/cm$^3$ or more and a thermal conductivity of 40 W/mK or more. The silicon nitride sintered body of the first embodiment of the present invention preferably has an extinction coefficient for light having a wavelength of 5 $\mu$m of 60 cm$^{-1}$ or less.

The present invention provides, in a second embodiment, a silicon nitride sintered body comprising 90% by weight or more of silicon nitride, 3.5% by weight or less of aluminum, 3.5% by weight or less of oxygen and from 0.01 to 10% by weight of at least one metallic element selected from the group consisting of Ti, Zr, Hf, V, Nb, Ta, Cr, Mo, W, Mn, Fe, Co, Ni, Nd, and Ho, the sintered body having a density of 3.15 g/cm$^3$ or more and a thermal conductivity of 40 W/mK or more. The silicon nitride sintered body of the second embodiment of the present invention preferably has an extinction coefficient for light having a wavelength of 5 $\mu$m of 60 cm$^{-1}$ or more.

DETAILED DESCRIPTION OF THE INVENTION

The present inventors have investigated that the low thermal conductivities of conventional $Si_3N_4$ sintered bodies are ascribable to phonon scattering which takes place due to pores present in the inner parts of the sintered bodies because of the low densities thereof and also due to internal defects attributable to the solid solutions formed by the inclusion of heteroatoms, particularly oxygen and aluminum atoms. Based on the above,- the present inventors have made studies in order to heighten the purity of an $Si_3N_4$ sintered body to reduce the amount of, particularly, oxygen and aluminum present as constituents of a solid solution and, at the same time, in order to increase the density of such a sintered body. As a result, an $Si_3N_4$ sintered body having high thermal conductivity has been obtained and the present invention has thus been accomplished.

That is, the $Si_3N_4$ sintered body according to the present invention can have a thermal conductivity as high as 40 W/mK or more because the amounts of aluminum and oxygen contained in the sintered body as impurities each is 3.5% by weight or less and, at the same time, the density of the sintered body is 3.15 g/cm$^3$ or more.

Since the $Si_3N_4$ sintered body of the first embodiment of the present invention has a high purity and high density as described above, it not only has high thermal conductivity but possesses light transmission, which is a peculiar property to the sintered body of the present invention and has not been possessed by most of the conventional $Si_3N_4$ sintered bodies. Specifically, the extinction coefficient of the $Si_3N_4$ sintered body of the present invention for light having a wavelength of 5 $\mu$m is preferably 60 cm$^{-1}$ or less.

Although an $Si_3N_4$ sintered body having a high purity and high density has been found to have both high thermal conductivity and light transmission as described above, light transmission is an undesirable property in applications such as IC packages which are required not to transmit light.

The $Si_3N_4$ sintered body of the second embodiment of the present invention can, accordingly, be prevented from transmitting light, without impairing the thermal conductivity thereof, by incorporating therein at least one metallic element selected from the group consisting of Ti, Zr, Hf, V, Nb, Ta, Cr, Mo, W, Mn, Fe, Co, Ni, Nd, and Ho. By the incorporation of such at least one metallic element, the extinction coefficient of the $Si_3N_4$ sintered body for light having a wavelength of 5 μm can be heightened, preferably to 60 $cm^{-1}$ or more, and light-screening properties sufficient for such applications as IC packages can hence be imparted.

It is considered that these metallic elements incorporated in the sintered body are in the form of nitrides or of compounds containing lattice defects or in other forms and serve to absorb or scatter light. If the incorporated amount of the at least one metallic element is below 0.01% by weight, the resulting sintered body has insufficient light-screening properties because of insufficient light absorption or scattering. On the other hand, if the amount thereof exceeds 10% by weight, the sintered body has a reduced thermal conductivity. Incorporation of metallic elements other than those enumerated above is not preferred in that the thermal conductivity of the sintered body is reduced or the desired light-screening properties cannot be obtained because light absorption or scattering becomes insufficient.

In producing the $Si_3N_4$ sintered body of the present invention, the particle diameter and purity of the raw $Si_3N_4$ powder should be strictly regulated. Specifically, the average particle diameter of the $Si_3N_4$ powder is regulated generally at 2 μm or less, preferably in the range of from 0.1 to 1.0 μm. Further, the oxygen content in the $Si_3N_4$ powder should be regulated at 1.5% by weight or less, and the amount of impurity cations and anions, such as Al, O, C ions and other ions, which are present as constituents of a solid solution, should be 1.0% by weight or less in total. Such a high-purity and fine $Si_3N_4$ powder can be synthesized by utilizing any of the reducing nitriding of $SiO_2$ powder, nitriding of Si metal, nitriding of an organic Si compound, gas-phase synthesis, and similar methods. Particularly preferred synthesis method of these is to nitride either of an imido or alkyl compound of Si and a silane compound. It is also preferred that the at least one metallic element selected from the above enumerated elements, e.g., Ti, incorporation of which is for light screening, is generally added in the form of a compound such as an oxide and an organometallic compound, and preferably in the form of an oxide.

In the case of the second embodiment of the present invention, the above-described $Si_3N_4$ powder is mixed with a powder of a metal compound for light screening. The $Si_3N_4$ powder or the mixture is then subjected to sintering. The sintering method is not particularly limited as long as it yields a sintered body having a density of 3.15 $g/cm^3$ or more, and a sintering aid may be or may not be used and the sintering may be conducted at ordinary pressure or with application of pressure. However, in the case of using a sintering aid, use of $Al_2O_3$, which releases Al and O atoms to form a solid solution with the $Si_3N_4$, or the like should be avoided and $Y_2O_3$ or the like is used. The sintering temperature should be from 1,500° to 2,200° C., preferably from 1,700° to 2,200° C. Further, the sintering is conducted in a non-oxidizing gas atmosphere containing $N_2$ in order to inhibit decomposition of the $Si_3N_4$.

The present invention will be explained in more detail with reference to the following Examples, but the invention is not construed as being limited thereto.

EXAMPLE 1

β-$Si_3N_4$ powder having an oxygen content of 1.2% by weight, a solid-solution impurity amount (the amount of impurities present as constituents of a solid solution) of 100 ppm or less, and a specific surface area as measured by the BET method of 5.0 $m^2/g$ (average particle diameter: about 0.3 μm) was synthesized by the reducing-nitriding of $SiO_2$ powder while inclusion of impurities was strictly prevented. This $Si_3N_4$ powder was then mixed with 2.0% by weight of a phenolic resin. The resulting powder mixture was heated at 750° C. in $N_2$ gas, thereby obtaining $Si_3N_4$ powder containing 0.8% of free carbon.

The thus-obtained $Si_3N_4$ powder was packed in a carbon mold coated with BN powder, and was then sintered in a high frequency induction furnace at a temperature of 2,000° C. for 20 hours in a stream of $N_2$ gas, while being pressed at 200 $kg/cm^2$. Thus, an $Si_3N_4$ sintered body having a diameter of 15 mm and a thickness of 5 mm was produced. This sintered body had a density of 3.15 $g/cm^3$ and its external appearance was of a white to gray color.

Analysis of the above-obtained $Si_3N_4$ sintered body revealed that it contained 0.1% by weight of oxygen and 3 ppm of Al and the content of any of the other cation and anion impurities was below 10 ppm. Further, this sintered body was shaped into a pellet having a thickness of 3 mm, and its thermal conductivity was measured and found to be 50 W/mK.

The above $Si_3N_4$ sintered body was then ground to a thickness of 0.3 mm and the front and back side surfaces thereof were lapped and further polished with grinding fine particles of diamond to give a 0.2 mm-thick sample. This sample was translucent and its extinction coefficient for light having a wavelength of 5 μm was 40 $cm^{-1}$ (linear transmission: 45%).

EXAMPLE 2

β-$Si_3N_4$ powder having an oxygen content of 1.2% by weight, a solid-solution impurity amount of 100 ppm or less, and a specific surface area as measured by the BET method of 5.0 $m^2/g$ (average particle diameter: about 0.3 μm) was synthesized by the reducing-nitriding of $SiO_2$ powder while inclusion of impurities was strictly prevented. This $Si_3N_4$ powder was mixed with 0.5% by weight, in terms of the amount of elemental metal, of at least one member selected from the group consisting of $TiO_2$, $ZrO_2$, $HfO_2$, $V_2O_5$, NbO, TaO, $Cr_2O_3$, Mo, W, MnO, Fe, Co, Ni, $Nd_2O_3$, and $Ho_2O_3$, 0.5% by weight of $Y_2O_3$ as a sintering aid, and 2.0% by weight of a phenolic resin.

Each of the resulting powder mixtures was packed in a carbon mold coated with BN powder, and was then sintered in a high frequency induction furnace at a temperature of 2,000° C. for 20 hours in a stream of $N_2$ gas, while being pressed at 200 $Kg/cm^2$. Thus, an $Si_3N_4$ sintered body having a diameter of 15 mm and a thickness of 5 mm was produced from each of the powder mixtures.

Each of the thus-obtained sintered bodies had a density of 3.15 $g/cm^3$ or more and its external appearance was of a black color. These Si₃N₄ sintered bodies were then ground to a thickness of 0.3 mm and the front and back side surfaces thereof were lapped and further polished with grinding fine particles of diamond to give 0.2 mm-thick samples. All these samples were translucent and their extinction coefficients for light having a wavelength of 5 μm were 100 cm⁻¹ or more (linear transmission: 13.5% or less).

Analysis of the above-obtained Si₃N₄ sintered bodies revealed that each sintered body contained 0.1% by weight or less of oxygen and 10 ppm or less of Al and the content of any of the other cation and anion impurities was below 10 ppm. Further, each sintered body was shaped into a pellet having a thickness of 3 mm, and the thermal conductivity was measured and found to be 50 W/mK or more for each sample.

According to the first embodiment of the present invention, an Si₃N₄ sintered body having an extremely high thermal conductivity as compared with conventional Si₃N₄ sintered bodies can be provided. This Si₃N₄ sintered body also has good light-transmitting properties, unlike conventional ones.

Therefore, the Si₃N₄ sintered body of the first embodiment of the present invention is useful particularly as a highly thermally conductive insulating substrate material for semiconductors, as well as optical materials and the like.

Furthermore, an Si₃N₄ sintered body having a far higher thermal conductivity than conventional ones and moderate light-screening properties can be provided by the second embodiment of the present invention. This Si₃N₄ sintered body is suited for applications such as IC packages which are required not to transmit light.

While the invention has been described in detail and with reference to specific embodiments thereof, it will be apparent to one skilled in the art that various changes and modifications can be made therein without departing from the spirit and scope thereof.

What is claimed is:

1. A silicon nitride sintered body comprising 3.5% by weight or less of aluminum, 3.5% by weight or less of oxygen and the balance of silicon nitride, said sintered body having a density of 3.15 g/cm³ or more and a thermal conductivity of 40 W/mK or more, wherein the extinction coefficient thereof for light having a wavelength of 5 μm is 60 cm⁻¹ or less, wherein the sintered body is produced by:

molding Si₃N₄ powder having an average particle diameter of 2 μm or less, an oxygen content of 1.5% by weight or less, and an impurity cation and anion amount of 1.0% by weight or less; and sintering the resulting molding at 1,500° to 2,200° C. in a non-oxidizing gas atmosphere containing N₂.

2. A silicon nitride sintered body as claimed in claim 1, wherein the density is 3.15 g/cm³ or more and the thermal conductivity is 50 W/mK or more.

3. A silicon nitride sintered body comprising 90% by weight or more of silicon nitride, 3.5% by weight or less of aluminum, 3.5% by weight or less of oxygen and from 0.01 to 10% by weight of at least one metallic element selected from the group consisting of Ti, Zr, Hf, V, Nb, Ta, Cr, Mo, W, Mn, Fe, Co, and Ni, said sintered body having a density of 3.15 g/cm³ or more and a thermal conductivity of 40 W/mK or more, wherein the extinction coefficient thereof for light having a wavelength of 5 μm is 60 cm⁻¹ or more, wherein the sintered body is produced by:

molding Si₃N₄ powder having an average particle diameter of 2 μm or less, an oxygen content of 1.5% by weight or less, and an impurity cation and anion amount of 1.0% by weight or less; and sintering the resulting molding at 1,500° to 2,200° C. in a non-oxidizing gas atmosphere containing N₂.

4. A silicon nitride sintered body as claimed in claim 3, wherein the density is 3.15 g/cm³ or more and the thermal conductivity is 50 W/mK or more.

5. A silicon nitride body as claimed in claim 3, wherein said silicon nitride powder which is subjected to said sintering contains a sintering aid, provided that said sintering aid does not form a solid solution with the Si₃N₄.

6. A silicon nitride sintered body comprising 3.5% by weight or less of aluminum, 3.5% by weight or less of oxygen, a sintering aid, provided that said sintering aid does not form a solid solution with the silicon nitride, and the balance of silicon nitride, said sintered body having a density of 3.15 g/cm³ or more and a thermal conductivity of 40 W/mK or more, wherein the extinction coefficient thereof for light having a wavelength of 5 μm is 60 cm⁻¹ or less, wherein the sintered body is produced by:

molding Si₃N₄ powder having an average particle diameter of 2 μm or less, an oxygen content of 1.5% by weight or less, and an impurity cation and anion amount of 1.0% by weight or less; and sintering the resulting molding at 1,500° to 2,200° C. in a non-oxidizing gas atmosphere containing N₂.

* * * * *